(12) United States Patent
Pethe et al.

(10) Patent No.: US 7,498,183 B2
(45) Date of Patent: Mar. 3, 2009

(54) FABRICATION OF CONDUCTIVE MICRO TRACES USING A DEFORM AND SELECTIVE REMOVAL PROCESS

(75) Inventors: Rajiv Pethe, Mountain View, CA (US); Michael A. Kast, Palo Alto, CA (US); Scott C-J. Tseng, Fremont, CA (US); Neil Bergstrom, Palo Alto, CA (US); Julius Kozak, Antioch, CA (US)

(73) Assignee: Southwall Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/804,473

(22) Filed: May 18, 2007

(65) Prior Publication Data

US 2007/0269935 A1    Nov. 22, 2007

Related U.S. Application Data

(60) Provisional application No. 60/817,642, filed on Jun. 29, 2006, provisional application No. 60/801,973, filed on May 18, 2006.

(51) Int. Cl.
*H01L 21/00* (2006.01)

(52) U.S. Cl. ............................ 438/21; 438/668; 257/773

(58) Field of Classification Search .................... 438/21, 438/668
See application file for complete search history.

(56) References Cited

U.S. PATENT DOCUMENTS

| | | | | |
|---|---|---|---|---|
| 4,039,397 A * | 8/1977 | Klemm | ........................ | 205/75 |
| 4,556,627 A | 12/1985 | Sullivan | ...................... | 430/312 |
| 5,071,206 A | 12/1991 | Hood et al. | .................. | 359/360 |
| 5,086,308 A * | 2/1992 | Takahashi et al. | ............. | 347/72 |
| 5,830,529 A * | 11/1998 | Ross | ........................... | 427/152 |
| 6,136,689 A * | 10/2000 | Farrar | ......................... | 438/626 |
| 6,844,253 B2 * | 1/2005 | Farrar | ......................... | 438/612 |
| 6,906,842 B2 | 6/2005 | Agrawal et al. | ............. | 359/265 |
| 7,074,341 B1 * | 7/2006 | Kurataka et al. | .............. | 216/22 |
| 7,077,972 B2 * | 7/2006 | Ishikawa et al. | .............. | 216/65 |
| 7,155,819 B2 | 1/2007 | McConville et al. | .......... | 29/847 |
| 7,214,611 B2 * | 5/2007 | Liu et al. | ..................... | 438/637 |

(Continued)

FOREIGN PATENT DOCUMENTS

WO    WO 2006/113400 A2    10/2006

*Primary Examiner*—N Drew Richards
*Assistant Examiner*—Ankush K Singal
(74) *Attorney, Agent, or Firm*—Schneck & Schneck; Terry McHugh

(57) ABSTRACT

In a method of forming micro traces, stamping techniques are employed to define a target pattern of the micro traces. The stamping is applied to electrically conductive material and may be limited to pressure, but a thermal stamping approach may be utilized. Following the stamping, a portion of the conductive material is removed, leaving the target pattern of conductive micro traces. In the pressure-application step, the pressure or the combination of pressure and temperature is sufficient to at least weaken the integrity of the bulk conductive material along the area of contact. Typically, this step causes shearing of the conductive material. Following the pressure-application step, excess conductive material is removed. In some embodiments of the invention, the thickness of the micro traces is not determined in a single step. The original thickness may be formed using a "seed" material. The subsequent material buildup may occur after the target pattern is established.

18 Claims, 7 Drawing Sheets

U.S. PATENT DOCUMENTS

| | | | |
|---|---|---|---|
| 2003/0152703 A1* | 8/2003 | Hammond et al. | 427/256 |
| 2003/0208895 A1* | 11/2003 | Chang | 29/428 |
| 2004/0013982 A1* | 1/2004 | Jacobson et al. | 430/320 |
| 2004/0124533 A1* | 7/2004 | Keser et al. | 257/758 |
| 2004/0174257 A1 | 9/2004 | Kuhns et al. | 340/508 |
| 2005/0045583 A1* | 3/2005 | Fujita et al. | 216/44 |
| 2005/0082700 A1* | 4/2005 | Deeman et al. | 264/2.5 |
| 2005/0097716 A1* | 5/2005 | Takakuwa et al. | 29/25.35 |
| 2005/0128543 A1* | 6/2005 | Phillips et al. | 359/15 |
| 2005/0133954 A1* | 6/2005 | Homola | 264/219 |
| 2005/0186774 A1* | 8/2005 | Gurumurthy | 438/618 |
| 2006/0006544 A1* | 1/2006 | Farrar | 257/773 |
| 2007/0092982 A1* | 4/2007 | Nien | 438/50 |
| 2007/0183047 A1* | 8/2007 | Phillips et al. | 359/572 |
| 2007/0237705 A1* | 10/2007 | Itoh et al. | 423/447.1 |
| 2008/0050659 A1* | 2/2008 | Ohtake et al. | 430/5 |
| 2008/0068280 A1* | 3/2008 | Koenig et al. | 343/873 |

* cited by examiner

US 7,498,183 B2

FABRICATION OF CONDUCTIVE MICRO TRACES USING A DEFORM AND SELECTIVE REMOVAL PROCESS

CROSS REFERENCE TO RELATED APPLICATIONS

This application claims priority from provisional applications No. 60/801,973, filed May 18, 2006 and No. 60/817,642, filed Jun. 29, 2006.

TECHNICAL FIELD

The invention relates generally to providing an optical arrangement and more particularly to providing a process for forming conductive micro traces.

BACKGROUND ART

There are a number of applications which would benefit from the use of conductive micro traces on a substrate, where the width of a micro trace as measured parallel to the surface of the substrate is 25 µm or less. In some of these applications, only the electrical properties of the conductive micro traces are significant, but others require consideration of the optical properties. Optical properties are significant if the micro traces are to be formed on vehicle or refrigeration windows to provide controlled window defogging and deicing or are to be formed on a plasma display panel (PDP) to control the level of electromagnetic radiation.

U.S. Pat. No. 5,071,206 to Hood et al., which is assigned to the assignee of the present invention, describes a filter arrangement which may be used for vehicle, housing and office windows. The Hood et al. patent states that the arrangement of layers for an optical filter should provide color correction, heat reflectivity and infrared reflectivity. The complexity in achieving a desired optical property is increased if the optical filter is combined with conductive micro traces for deicing or defogging.

Factors which must be considered within the design of an optical filter for a PDP include the degree of neutrality of transmitted color, the level of reflected light, the color shift with changes in the incidence angle of a viewer, and the transmission levels of infrared and electromagnetic radiation. FIG. 1 is one possible arrangement of layers to provide a filter for a PDP, which includes a module or separate glass sheet 10. An Etalon filter 12 is formed on a polyethylene terephthalate (PET) substrate 14 that has been affixed to the glass sheet by a layer of adhesive 16. Because a plasma display generates infrared radiation and electromagnetic radiation that must be controlled in accordance with legislated regulations, the filter layers 12 are designed to reduce undesired radiation from the display. Etalon filters based on multiple filter layers are used to screen infrared wavelengths and electro-magnetic waves. Interference between adjacent filter layers can be tuned to cause resonant transmission in the visible region, while providing desirable screening. FIG. 1 also includes an antireflection (AR) layer stack 18 that was originally formed on a second PET substrate 20. Antireflection layer stacks are well known in the art. A second adhesive layer 22 secures the PET substrate 20 to the other elements of FIG. 1.

The formation of conductive micro traces on a substrate for application to a PDP may be used to further reduce electromagnetic radiation. The tradeoff is that the presence of the micro traces may adversely affect the overall optical properties. A second concern is cost. A process for forming conductive micro traces is preferably able to achieve a small width dimension in a cost-efficient manner.

SUMMARY OF THE INVENTION

A method of forming micro traces includes applying stamping techniques to an electrically conductive material so as to define a target pattern of the micro traces. The stamping techniques may be limited to pressure, but a thermal stamping approach may be utilized. Following the stamping, a portion of the conductive material is removed so as to leave the target pattern of conductive micro traces.

Approaches for providing the original "bulk" conductive material include, but are not limited to, direct vacuum deposition, a vacuum deposition followed by a buildup (e.g., plating) of additional material, aligning a metal foil to the substrate, spin or spray coating, web coating, and chemical vapor deposition. The desired thickness of the conductive material is dependent upon the target application, the required width of the conductive micro traces, and the substrate on which the target pattern is formed.

In the pressure-application step, the pressure or a combination of pressure and temperature is sufficient to at least weaken the integrity of the bulk conductive material along the area of contact. The depth of deformation is dependent upon the applied pressure, the temperature, and the flexibility and softness of either the raw substrate or the layers added to the raw substrate. Particularly for embodiments that utilize the thermal stamping approach or other thermal processing, there are advantages to using a raw substrate formed of a thermoplastic material. Preferably, the pressure-application step causes shearing of the conductive material.

Following the pressure-application step, excess conductive material is removed using techniques such as peeling, mechanical removal, or chemical processes. For the peeling or an ultrasonic cleaning process, the target pattern should have a stronger adhesion than the area of conductive material that is to be removed. If desired, weakened adhesion between the "excess" material area and the substrate can be achieved by utilizing one or more release layers or a thermoplastic material between the conductive material and the substrate. Additional layers are also beneficial if mechanical processes are to be utilized for material removal. Acceptable mechanical processes include milling and sanding.

The width dimension of the micro traces is measured as being parallel to the substrate on which the micro traces are formed. The micro traces preferably have a width of less than 25 microns. In the pressure-application step, shearing (or at least structural weakening) occurs at the opposite edges of each micro trace, so that the "double shearing" is within 25 microns. The thickness of the micro traces is perpendicular to the substrate surface. This thickness may be established in a single step of providing the conductive material, but in some applications of the invention, the thickness is determined in more than one step. In a first step of establishing the thickness of the micro traces, a seed layer is provided. The advantage is that fine features of micro traces can more easily be established. Subsequently, the second material-formation step provides material buildup onto the seed layer. Thus, the first material-formation step may be directed to achieving desired optical properties, while the second material-formation step may be specific to achieving desired electrical properties while maintaining the optical properties.

For applications that use the seed layer prior to material buildup, seed layer patterning may be executed in the manner that was previously described. Thus, pressure stamping and then peeling may be employed or thermal stamping and then peeling or transfer may be utilized. Acceptable processes for the following buildup of material include, but are not limited to, soldering and electroplating. Electroplating may include electroless plating, conventional electroplating, and a combination of the two. The preferred approach is electroplating. A confined trench may be used in the material buildup. The reliability of the trench is a result of the fact that the dimensions, the shapes of the micro traces, and the trace pattern can be easily manipulated to satisfy the target requirements for conductive micro traces.

The conductive micro traces may be formed on a surface of a transparent substrate that is then applied to an optically relevant substrate. In many applications, the transparent substrate will also have a sequence of layers that cooperate to provide optical filtering. For example, the substrate may be PET having an antireflection coating. The conductive micro traces may be formed on the same side of the substrate as the coating or on the opposite side. When on the same side, the coating may be formed either before or after the formation of the conductive micro traces. However, the use of a coating is not a requirement of the invention. The applications of the invention include, but are not limited to, building retrofits, refrigeration glass, automotive panels for which heating is desired, plasma display panels, touch panels, and solar cells.

DETAILED DESCRIPTION

Figure 1:
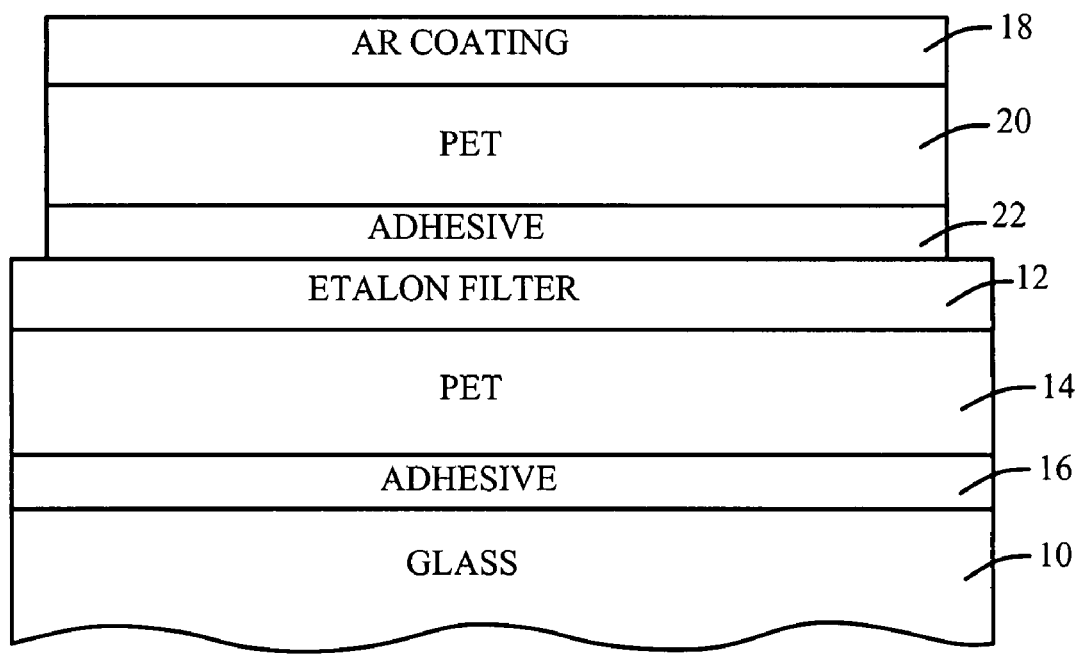
FIG. 1 is a cross sectional view of a filter on a plasma display panel suitable for the present invention.

The present invention involves sourcing of a flexible substrate, such as PET, that has been provided with a conductive material such as metal. The provision of a conductive medium onto the PET could be performed through, but is not limited to, direct vacuum deposition, or vacuum deposition followed with plating, thermal processing, adhering or other bonding or aligning of metal foil to the flexible substrate, or spin or spray coating, or web coating, or chemical vapor deposition. The selection of the technique used to coat the conductive material is dependent on the material and thickness to be coated, substrate compatibility to the processing condition, and economic viability. The desired thickness of the conductive material is dependent upon the target application, the required width of the conductive micro traces, and the substrate being used. While the substrate will often be referred to herein as a "metallized substrate," persons skilled in the art will recognize that the conductive material on the substrate may be a non-metal, such as a conductive polymer.

The metallized substrate is then subjected to a pressure process in which selected regions are pressed into the surface of the flexible substrate. The pattern generated using such a process will depend on the nature of the pattern on the stamp tool being used. The "stamp tool" may be in the form of an appropriately configured roller or an appropriately configured device that cooperates with a moving web of the metallized substrate to provide a roller-like action. In the pressure step, the depth of deformation is dependent upon the applied pressure, temperature, flexibility and softness of the raw substrate and/or any additional coatings that may overcoat the raw substrate. In some applications of the invention, thermal processes (such as thermal stamping) are employed. Particularly for such applications, there are advantages to using a raw substrate formed of a thermoplastic material. The dimensions and the hardness of the patterning tool to be used to create a shear also affect the depth of the deformation. Application of additional coatings, such as organics, soft adhesives, or release layers can be utilized to further improve the dimensions of the patterns. The process can be a semi permanent process where the deformation exists only through the excess conductive material removal process.

After the excess conductive material is removed, the remaining conductive material may relax to a non stressed, non indented or partially indented state. The excess conductive material on the areas that do not form the micro traces can be removed through use of a number of possible processes. A non-exhaustive list of examples of such material removal processes are peeling, mechanical removal, solvent or solution based removal, and ultrasonic cleaning. The peel or ultrasonic cleaning processes will work particularly well if the metallization has been formed on a release layer between the metal coating and the underlying substrate. The mechanical removal process can be additionally or better controlled if there is a sacrificial layer between the metal and the flexible substrate. The mechanical removal process may then damage the sacrificial layer which is then washed away using chemicals. As still another alternative, if the substrate itself is not a thermoplastic (e.g., PVB polycarbonate), a thermoplastic material may be provided between the substrate and the conductive material. Then, if in subsequent processing, temperature and/or pressure is employed, there will be a "differential adhesion" of the conductive material that is subjected to the processing relative to the conductive material that is not. This "differential adhesion" refers to the adhesion of the areas of conductive material to the underlying material (thermoplastic).

Figure 2:
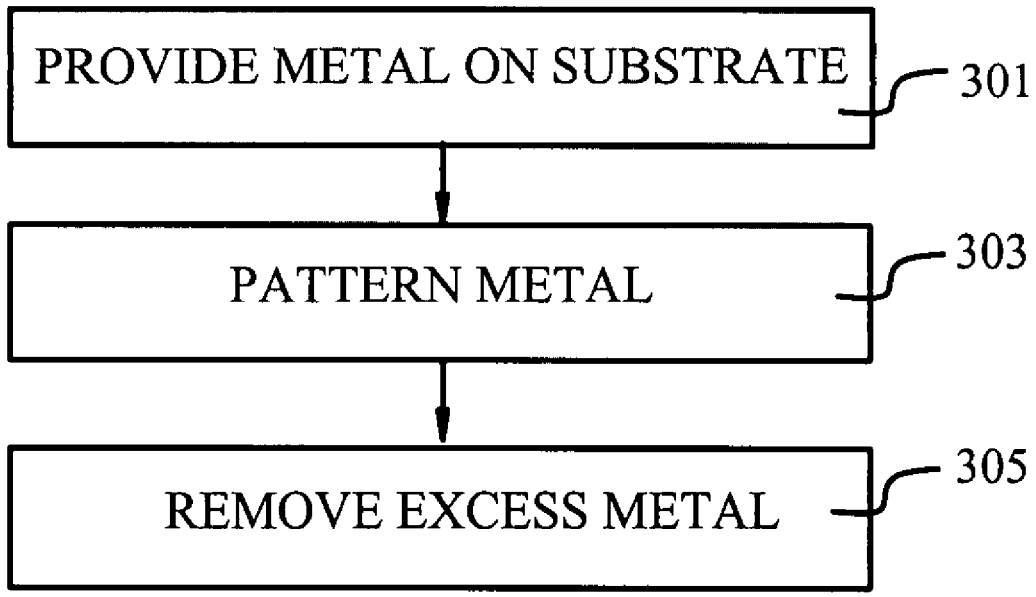
FIG. 2 is a simplified process flow of steps for implementing the present invention.

The preferred embodiment of the invention comprises three major steps (301, 303 and 305 in FIG. 2) during the making of traces of material on flexible plastic substrates. Economically viable systems can be designed in which all major steps are performed on the one system. The three major steps are:

A. Provide conductive material 301 on MYLAR®, a federally registered trademark of Dupont Teijin Films (or other plastic substrate), referred to as "metallized MYLAR."
  B. Pattern generation 303 on metallized MYLAR
  C. Excess conductive material removal 305 from metallized MYLAR.

A. Provide conductive material on MYLAR: Multiple alternative techniques are available to coat a conducting material onto a plastic substrate, such as MYLAR, PET, thermoplastic or other suitable substrate. Vacuum deposition processes, such as sputtering or evaporation, are commonly used and are readily commercially available. However these commercially available options are typically limited to very thin coatings. The maximum thickness of conductive material using typical vacuum deposition processing that is limited to about 5 um. Beyond this thickness, film stresses could cause global or localized deformation in the substrate, rendering the coated substrate unusable for some applications. The size of the grains in the coating formed using vacuum techniques tends to be very small. The use of metallized MYLAR produced with such vacuum techniques may be limited to applications requiring thin conductive materials and applications in which this conductive material is used as an initial seed layer, either before or after pattern generation 303, as will be described fully below.

Figure 3:
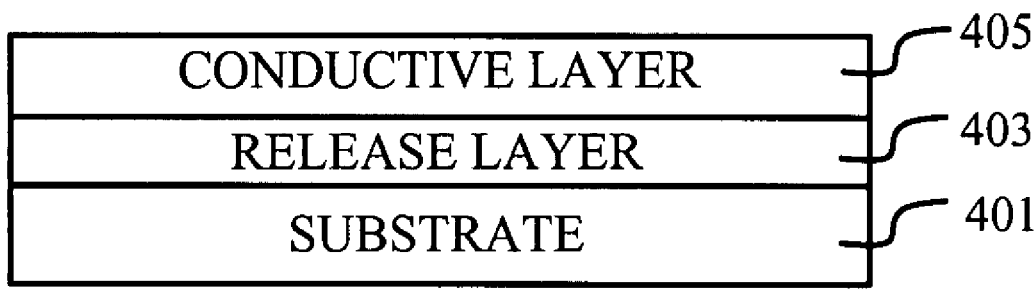
FIG. 3 is a side view of one possible embodiment of the invention following the formation of a conductive material on a substrate.

For those applications in which vacuum deposition coatings are appropriate, the coating may be applied to a plastic substrate with or without an intermediate release layer. In the embodiment of FIG. 3, a release layer 403 is shown between the substrate 401 and the metal layer 405. Vacuum deposition onto plastic substrates without a release layer causes the film to strongly adhere to the plastic. However, this adhesion strength is limited by the thickness of the metal layer. Increasing the metal thickness may induce significant stress in the film, causing an undesirably quick and random release that results in only partially metallized areas on the plastic substrate. Alternatively, thermoplastic may be substituted for the release layer, where the substrate is not a thermoplastic and thermal and/or pressure processing is used to define the pattern of micro traces. Then, the processing will change the properties of the thermoplastic material, providing a "differential adhesion" at areas to which heat and/or pressure is applied as compared to areas that do not receive such processing conditions.

For applications in which the metal film 405 thickness is required to be greater than about 5 um, the vacuum deposition could be followed with a plating step. In such cases, the vacuum deposition is essentially a seed layer for the electroplating step. Liquid based coating techniques such as spin or spray coating, or web coating, or electroplating, or electroless plating can result in very thin to tens of microns thick coatings. Electroplated coatings tend to result in metal coatings that have large grains, resulting in strong films. Another approach to providing thick metal onto the plastic substrate 401 is to laminate metal foil onto the plastic substrate. Such lamination processes are typically performed using a pressure sensitive adhesive between the plastic substrate and metal foil. In such cases, the metal thickness could be in hundreds of microns or more. In cases where the material deformation/shear is significantly deep, the thickness of the adhesive can be adjusted so as to allow the deformation to go into the thick adhesive without affecting the underlying plastic substrate.

Figure 4:
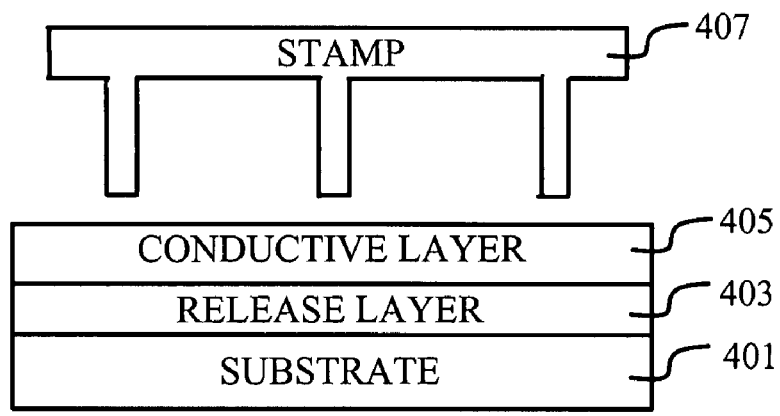
FIG. 4 is a side view of the structure of FIG. 3 prior to application of pressure for the shearing step.
Figure 5:
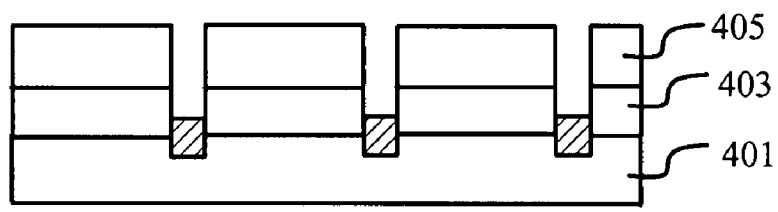
FIG. 5 is a result of the application of force of 4.

B. Pattern generation on metallized MYLAR: Pattern generation on the metallized plastic substrate 401 can be achieved by use of a pre-patterned stamp, such as the stamp 407 shown in FIG. 4. This stamp could be either in the form of a cylinder (roller) for web processing or flat for processing of sheets. That is, the invention may be used with roll-to-roll (web) fabrication or with piece-by-piece fabrication. For the web fabrication processing, the stamp may be stationary, but may be cooperative with the roll-to-roll movement of the substrate to provide the roller-like action that was previously noted. The material used to make the stamp could depend on the thickness and strength of the metal layer in the metallized plastic substrate. If the metal layer 405 thickness or processing conditions are conducive to creating large grain structure within the metal layer, a stamp tool must be able to break the grains (shearing), or at least significantly distort the metal layer to sufficiently weaken the integrity of the material of the opposite edges of each micro trace, thereby defining the desired pattern. The shape and size of the patterning tool is dependent on the substrate. FIG. 5 illustrates the structure after the metal layer and release layer have been pressed at least partially into the substrate.

Figure 6:
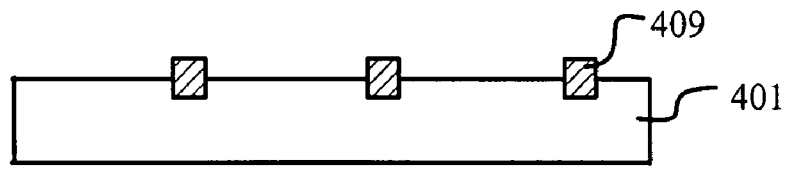
FIG. 6 is a final product in accordance with one embodiment of the invention.

C. Metal removal from metallized MYLAR: The excess (non-recessed) metal (or other conductive material) is removed from the plastic substrate 401 after the features (conductive micro traces) have been imprinted on the surface of the metal. The processes of imprinting the pattern of conductive micro traces 409 causes the metal layer to be at least partially embedded into the substrate, as shown in FIG. 6. Metal removal can be done through any of a variety of techniques, such as milling, sanding, peel off, ultrasonic cleaning, etc. The selection of the technique is dependent on the properties of the interface between the metal and the underlying plastic substrate. Excess material techniques can be further facilitated using either pressure differential between the front and back surfaces of the substrates or using vacuum to hold the substrate to a mechanical backing during the excess material removal process. Mechanical removal processes such as milling or sanding can be used irrespective of the adhesion between the metal and plastic substrate. Proper control of the material removed during the sanding or milling process will give the appropriate dimension features, since the desired features are recessed into the substrate. Proper selection of the milling or sanding material is also significant.

Peel off is an alternative excess metal removal technique. Peel off techniques are usable if the adhesion between the metal layer and the plastic substrate is weak. If desired, weaker interfaces can be achieved if the metal is deposited or laminated onto a release layer. If the interface between the metal and the plastic substrate is reasonably weak, tacky tape, could be brought into temporary contact with the metal surface. Such action would remove the non-recessed metal areas and transfer the excess metal to the tacky tape, resulting in a plastic substrate with the desired features. Alternatively, if the strength of the metal film is sufficiently strong and the adhesion is sufficiently weak, the metal layer could easily be peeled from the plastic substrate without use of any tacky surface.

In cases in which the metal film has been either deposited or laminated onto a material that can be dissolved, such as a pressure sensitive adhesive (PSA) or a release layer, solvents could be used to remove the excess metal material. This dissolvable material would be between the plastic substrate and the metal film. If the metal film has been recessed into the plastic substrate and the release layer or PSA is not exposed directly, solvents could be used to wash away the metal film.

The substrate 401 of FIG. 6 having the pattern of conductive micro traces 409 may also have an optical coating. For example, if the substrate is intended for use on a vehicle windshield or on a window of a home or office building, a solar control coating may be included on the same side or the opposite side as the traces. Other applications include, but are not limited to, antenna structures of RFIDs (radio frequency identifiers), glass doors of refrigeration units, solar devices, plasma display devices, and other transparent structures that require heating or EMI control.

SPECIFIC EMBODIMENTS

Figure 7:
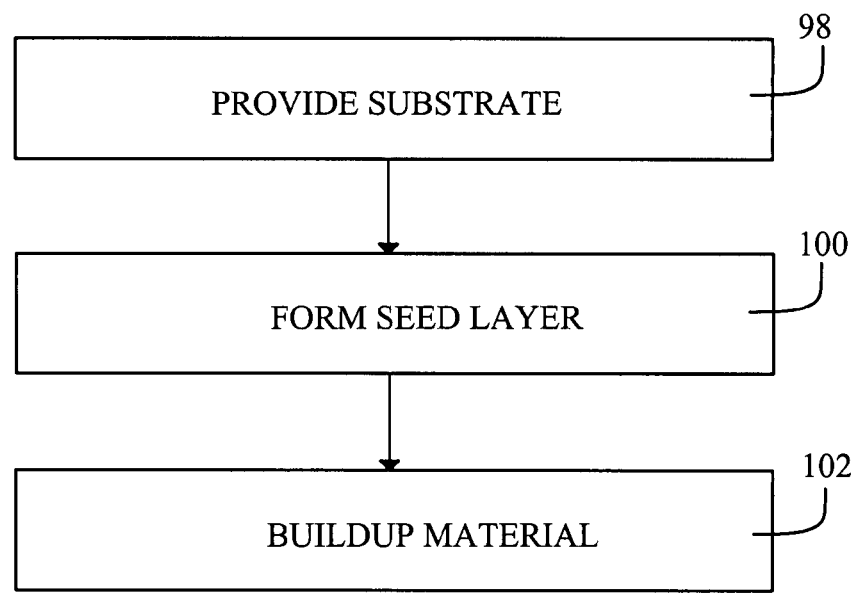
FIG. 7 is a process flow of steps for providing conductive micro traces in accordance with the invention.
Figure 8:
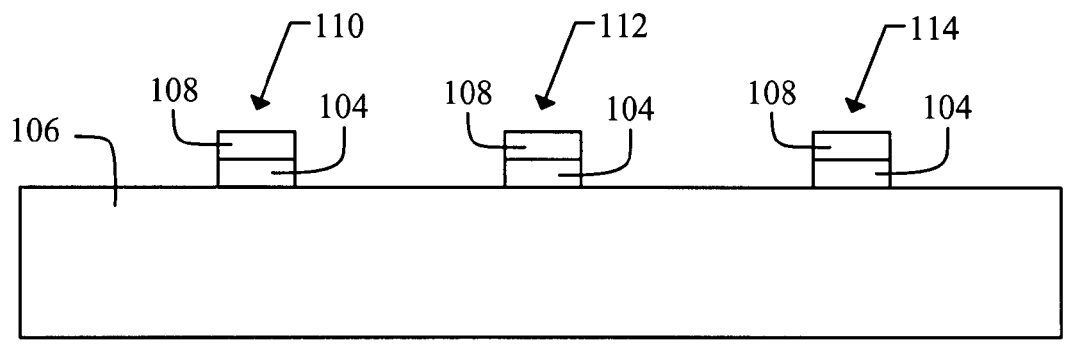
FIG. 8 is a side view of the substrate having conductive micro traces in accordance with the invention.

With reference to FIGS. 7 and 8, after a substrate-provision step 98, the approach for forming the thickness of conductive micro traces (CMTs) can be divided into two separate processes, namely a seed layer patterning step 100 and a trace buildup step 102. The seed layer patterning may be achieved as described above and will provide fine-feature capability and sufficient conductivity to support the second step of material buildup. The seed layer 104 on the substrate 106 combines with the buildup material 108 to define CMTs 110, 112 and 114.

The two-step processing may involve a number of substeps, such as when the seed layer or a polymer layer is first deposited and then patterned to define the desired CMT arrangement for the subsequent trace buildup, but the various techniques that will be described below fit within the generalized process flow of FIG. 3. Moreover, the invention may be implemented upon a flexible substrate while the substrate material is moved between two rolls (i.e., roll-to-roll processing), but other implementations are contemplated, such as batch processing upon separate rigid or flexible substrates.

Figure 9:
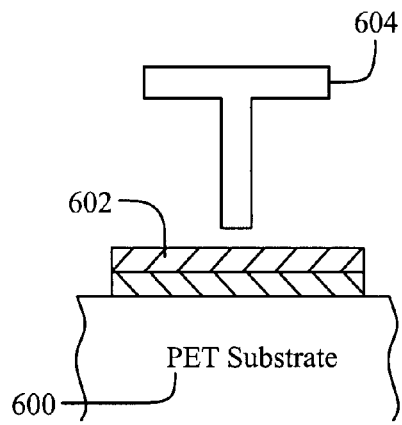
FIGS. 9-13 illustrate a process flow of steps for a seed-and-buildup approach in accordance with the invention.
Figure 10:
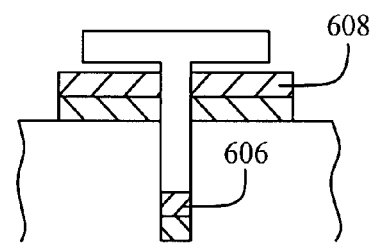
Figure 11:
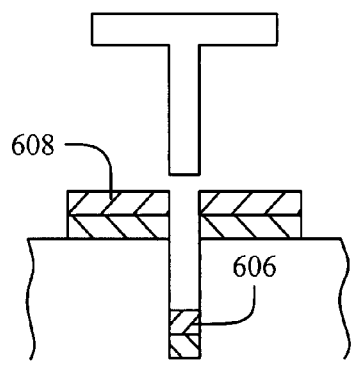
Figure 12:
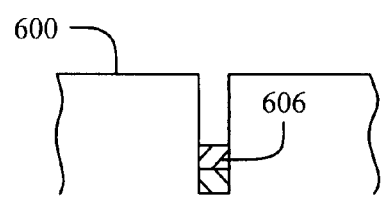
Figure 13:
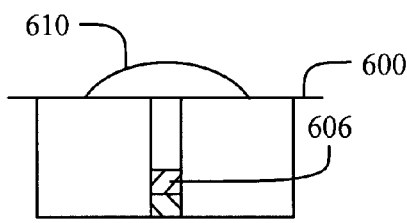

Stamp and Peel Technique: This technique involves use of a substrate provided with the conducting material. The conducting material must have a weak adhesion to the underlying substrate. The weak adhesion could be provided through the use of release layers and/or through selection of appropriate process deposition conditions. The substrate is then subjected to an embossing-like process where fine featured patterns are imprinted onto the substrate by applying pressure. The substrate or the embossing tool may benefit from being heated while applying pressure. The result of this stamping/embossing process causes the conducting layer to be pressed into the surface of the substrate. The conducting material in the non-embossed or patterned area is then removed using tacky tape, or is washed off using a chemical removal approach (e.g., solvents), or is eliminated using a mechanical removal approach (e.g., milling). The features that may be generated by means of this technique can have any of a wide range of common or uncommon shapes and dimensions. One possible embodiment of this technique is shown in FIGS. 9-13. A web of flexible material 600 (e.g., PET) with a metal foil 602 on one side is stamped with a tool 604 in a manner to press segments 606 of the foil into the flexible material, as shown in FIGS. 9 and 10. That is, indents of metal are formed in the surface of the substrate. In FIG. 11, the tool is removed. The excess material 608 is then removed from the surface (FIG. 12) and, if required, metal 610 is grown to the appropriate thickness (FIG. 13).

Thermal Transfer and Peel Technique: In a related approach, heat is used to transfer metallization, rather than pressure. That is, rather than a pressure-stamping tool, a hot-stamping tool may be employed. The metallization may be a copper foil leafing, such as the type used in the artwork industry.

There are alternative approaches to applying the thermal transfer and peel technique. As one possibility, metal leafing material may be laminated to a transfer tape that is applied to a substrate. For example, a thin sheet of copper metal foil may be laminated to an adhesive strip. After the hot-stamping tool is applied, the remaining copper foil may be removed, leaving conductive pattern lines in the areas contacted by the tool. For example, ultra narrow conductive pattern lines may be interconnected by a foil bus at one or both ends of the lines. The lines and the foil bus may function as the seed layer for subsequent material buildup, such as the use of electroplating to increase thickness.

In one experimental use of the invention, conductive pattern lines were achieved using copper foil transferred onto an adhesive surface and easily removed at locations in which the adhesive did not exist. Where needed, the adhesive was removed easily with acetone. The measured sheet resistance was determined to be 1.5 ohms/square.

Transfer Technique: The transfer technique involves moving the conductive material from a donor substrate to a receiving substrate. In order to achieve this transfer, the conductive material should be weakly adhered to the underlying substrate. This again could be done through use of release layers or appropriate deposition process conditions. In fact, this material could be identical or similar to the material used in the Stamp and Peel Technique. The donor material may also have or require an additional adhesive layer on top of the conductive material. The conductive layer is transferred to the receiving substrate through use of a patterned stamp, and through application of pressure and also possibly temperature. The advantage of this technique over the Stamp and Peel Technique is that there is less wastage. However, the feature dimensions and cosmetics are significantly better in the Stamp and Peel Technique than the transfer process. With either of these two techniques, the process may include temperature and pressure regulation. Heating may be used to maintain the temperature within the range of 40° C. to 80° C. The target pressure may be 5000 psi.

Figure 14:
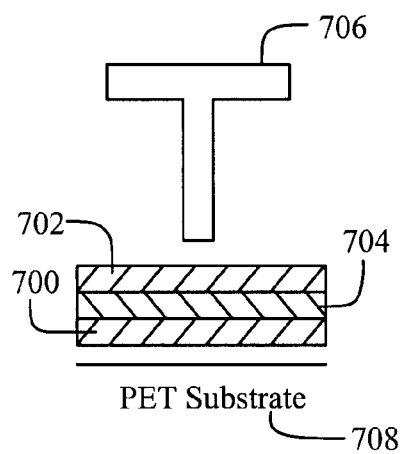
FIGS. 14-17 illustrate a process flow of steps for a transfer approach in accordance with the invention.
Figure 15:
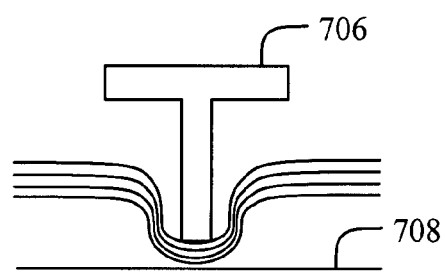
Figure 16:
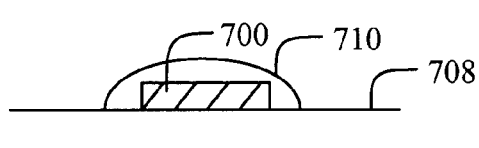
Figure 17:
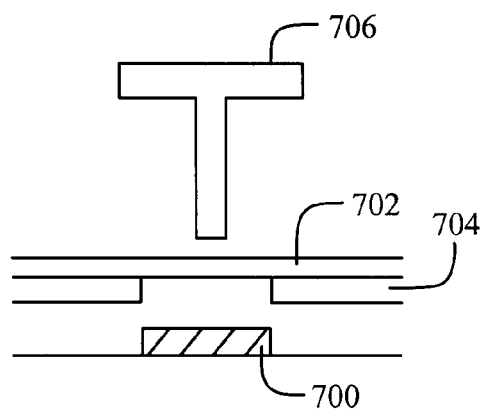

FIGS. 14-17 illustrate one embodiment of the transfer technique. A conductive material 700 is formed on a donor substrate 702. In the embodiment of FIG. 14, a release layer 704 is included. A stamp 706 is located above the donor substrate and a PET substrate is on the opposite side of the substrate and its layers. In FIG. 15, the conductive layer 700 is gently pressed onto the PET substrate 708 by the stamp 706. When the stamp is removed, the conductive material 700 (and possibly the release layer 704) remain on the surface of the PET substrate 708 (FIG. 16). Then, the metal layer is grown to include additional conductive material 710, as shown in FIG. 17.

Some of the embodiments described above include building up the final trace using the electrical conductivity of the seed layer. An acceptable process for this material buildup is electroplating. As is well known in the art, electroplating enables the deposition of a variety of metallic coatings onto substrates of various materials. The types of electroplating commonly used for EMI shielding include electroless plating and electrolytic plating.

Electroless plating is also known as autolytic plating and is a chemical process for depositing certain metals. In contrast to electrolytic plating, no external electrical current is required to sustain the process. The electroless plating process is based upon the catalytic reduction of metal ions on the surface of the substrate being plated. An advantage of electroless plating is that even complex surface geometries can be coated evenly.

For electrolytic plating, the component to be coated is immersed in a solution containing ions of the material that is used for plating up the seed layer. An electrical current is conducted through the component into the solution. Thus, the seed layer is charged and acts as a cathode for attracting the metals ions from the solution. This process can be regulated by the control of voltage, amperage, temperature, time and density of ions. With regard to the use of electrolytic plating with the present invention, both sides of the substrate may be immersed in the conventional manner or only the side of the substrate on which ions are to be attracted may be immersed. Electro-plating on a substrate for use with plasma display panels and glass for vehicles, buildings, refrigerators and the like is described in the patent document PCT/US06/13993 to Hood et al., which is assigned to the assignee of the present invention and is incorporated herein by reference.

Other approaches to providing material buildup are contemplated. For example, the use of wave solder technology may be used to add conductive material to a seed layer. Thus, conductor buildup on a thin seed layer can be accomplished through exposure of the patterned conductive material to liquid metal such as low temperature alloy solder. A wettable seed layer, such as a relatively thin metallic film, allows retention of liquid metal after exposure. Even a relatively temperature-sensitive polymer substrate, such as PEN or PET can tolerate the temperatures of a low melting point molten metal, if exposure is sufficiently limited.

As is known in the art, one conventional circuit board solder method used in commercial production is generically termed "wave solder." Wave solder technology generates ripples or waves of molten solder which travel along a channel and contact the underside of a suspended circuit board. As the circuit board face, wire leads and contact pads are exposed to the wave of solder, wettable areas are coated by molten solder, while masked areas are not coated. When the wave travels beyond the circuit board, the solder cools in place and electrical connections are completed.

A process modeled after this conventional wave solder technology can be incorporated into the CMT buildup of a seed layer. The seed layer can be within a groove or simply exposed on the plane of the substrate, similar to conventional printed circuit boards. The total mass of the solder transferred to the substrate is low for CMT applications, allowing use of relatively expensive solders. The preferred properties of this solder are high electrical conductivity, low melting temperature, and low viscosity. As with conventional circuit board processing through wave solder technology, the large surface area of substrate not patterned with the wettable seed layer must perform as a solder "mask," non-wettable or hydrophobic to the molten solder of choice. An advantage of this process is that it minimizes thermal damage to the target substrate, as it limits the time exposure of the substrate to the high temperature molten bath. The use of low temperature melting point solder is important in limiting thermal damage. An advantage of the use of this technology relative to electroplating as described above is that it is not necessary to conduct an electrical current through the seed layer.

Figure 18:
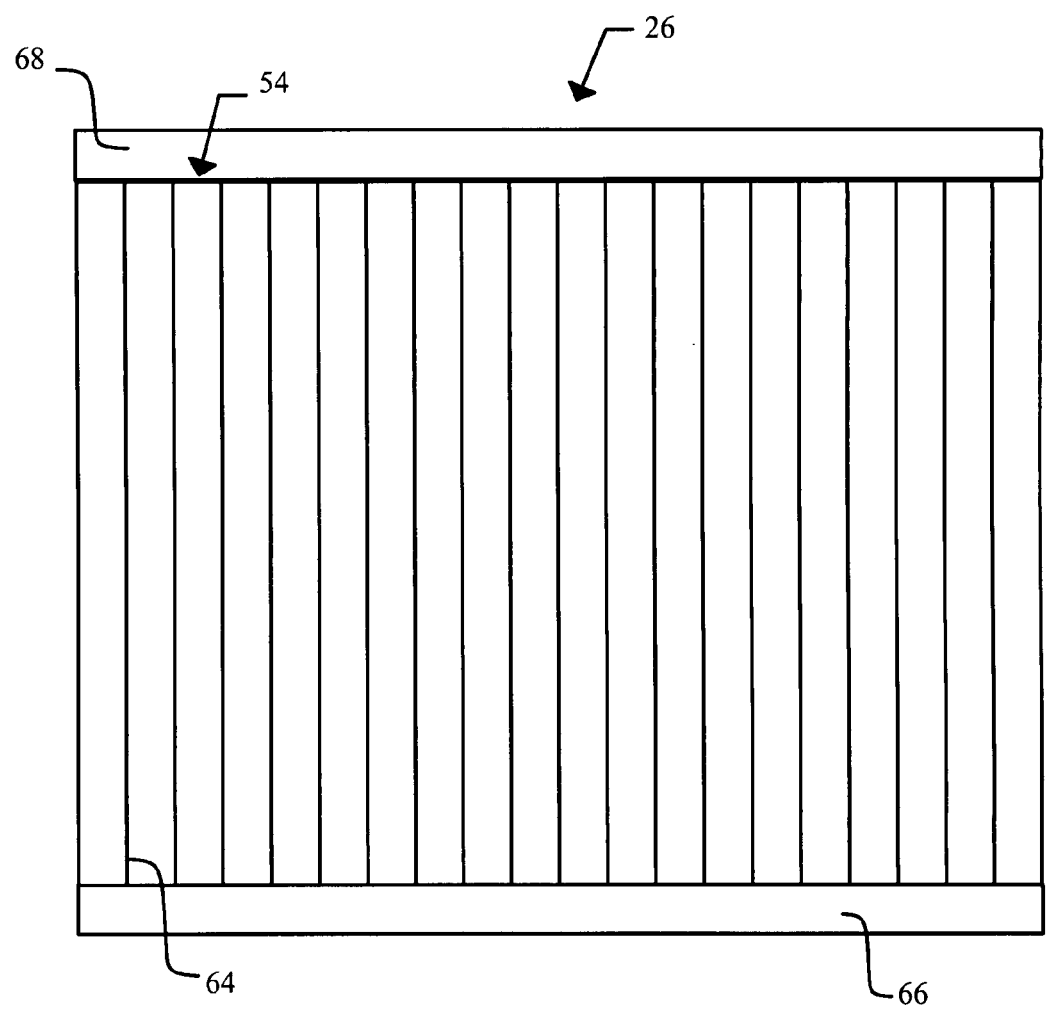
FIG. 18 is a top view of one application of the invention.

FIG. 18 shows one possible embodiment of the invention. In this embodiment, the conductive micro traces are used for forming current-carrying elements, such as heating elements on a windshield of a vehicle. Parallel conductive micro traces 64 are connected at opposite ends to buses 66 and 68 which provide power for activating the conductive micro traces. Thus, within the center region 54 of the assembly, the heating elements may be used for defogging or defrosting reasons. On the same side or the opposite side of the substrate on which the conductive micro traces are formed, an optical filter (indicated by the reference numeral 26) may be included. However, the invention may be used in applications that do not include optical filters or other types of coatings. Other applications of the invention include (1) providing defogging or defrosting of a window within a refrigeration unit, (2) providing a low sheet resistance for devices such as plasma panel displays, and (3) achieving desired optical properties for solar cells or for touch panels of a display screen.

CMT production processes are generally described as applicable to laminated structures as, for example, where the CMT film is laminated between glass with adhesive interlayers. Another group of potential applications of CMT films falls within the general description of "applied films." Applied films as used herein pertain to optical films such as XIR solar control films or CMT films which are integrated into the end glazing system as a surface film rather than an embedded laminate layer. Such applications may be performed in the factory or as aftermarket services and include retrofitting enhanced glazing systems on architectural glass and automotive glass and the addition of EMI and anti-glare filters on electronic displays. Where the CMT process includes a resin layer surrounding most but not all sides of the trace, the resin layer could be designed to serve as a pressure sensitive adhesive (PSA) used to mount the film to the exposed glass surface. Because the conductive traces are exposed in this PSA layer, busbar and termination connections can be placed either directly on the glass receiving the film or onto the CMT applied film prior to mounting onto the glass surface.

What is claimed is:

1. A method of forming micro traces comprising:
providing an electrically conductive material on a surface of a second material;
applying pressure at selected areas of said conductive material, including selecting said selected areas on a basis of providing a particular target pattern of micro traces and including applying sufficient pressure to at least weaken integrity of said conductive material along said selected areas; and
removing a portion of said conductive material so as to leave said target pattern of micro traces, wherein applying said pressure at said selected areas and removing said portion of said conductive material are executed to separate said conductive material within said selected areas from said conductive material in areas directly adjacent to said selected areas.

2. The method of claim 1 wherein said step of applying said pressure includes shearing said conductive material along said selected areas to provide disconnection of said conductive material along opposite edges of each said micro trace.

3. The method of claim 1 wherein applying said pressure includes using roller-like action in applying pressure-application features which are configured to define said micro traces.

4. The method of claim 1 wherein applying said pressure includes implementing thermal stamping such that said conductive material within said selected areas deforms and is at least partially embedded into said second material.

5. The method of claim 1 wherein providing said electrically conductive material includes using a transparent substrate as said second material, said target pattern being configured to establish an electrical circuit when applied to glass.

6. The method of claim 1 wherein providing said conductive material includes depositing said conductive material on a flexible substrate.

7. The method of claim 1 wherein providing said conductive material includes coating a flexible substrate.

8. The method of claim 1 wherein removing said portion of conductive material includes peeling said portion to leave said target pattern of micro traces, wherein removing said portion leaves said conductive material only within said selected areas.

9. The method of claim 1 wherein removing said portion of conductive material includes using one of mechanical removal and chemical removal and wherein removing said portion leaves said conductive material only within said selected areas.

10. The method of claim 1 further comprising forming a release layer on a substrate, said release layer being said second material, wherein removing said portion of conductive material includes removing said release layer from said substrate, wherein removing said portion leaves said conductive material only within said selected areas.

11. The method of claim 1 further comprising forming a sacrificial layer on a substrate, said sacrificial layer being said second material, wherein removing said portion of conductive material includes using at least one of a mechanical removal process and a chemical removal process.

12. The method of claim 1 further comprising forming a solar control sequence of layers in addition to said target pattern of micro traces.

13. The method of claim 1 further comprising building up a thickness of said micro traces, such that a combined thickness of target pattern in the range of 5 μm and tens of microns is achieved in at least two steps of providing conductive material.

14. A method of forming micro traces comprising:
providing an electrically conductive material on a surface of a second material;
utilizing stamping techniques to define a target pattern of said micro traces; and
building up said conductive material at said target pattern to achieve a combined thickness of said micro traces, said building up including using a material that is electrically conductive;
wherein utilizing said stamping techniques includes applying pressure at selected areas of said conductive material while said conductive material remains in a solid state, with said pressure being sufficiently great to at least weaken integrity of said conductive material along opposite edges of each micro trace within said target pattern of micro traces.

15. The method of claim 14 wherein utilizing stamping techniques includes peeling a portion of said conductive material, leaving said target pattern, wherein said portion excludes that said conductive material within said selected areas to which pressure was applied.

16. The method of claim 14 wherein utilizing stamping techniques includes applying a thermal stamping approach to embed said conductive material to a level below said surface of said second material, thereby defining said target pattern.

17. The method of claim 14 wherein providing said electrically conductive material includes depositing said conductive material on a flexible substrate for attachment to a window, including selecting said target pattern to form an electrical circuit.

18. The method of claim 17 further comprising forming an optical coating on said flexible substrate.

* * * * *